United States Patent [19]

Bowden et al.

[11] 3,941,165
[45] Mar. 2, 1976

[54] WIRE LEAD STRAIGHTENING DEVICE

[75] Inventors: James E. Bowden, Mountain View; Robert H. Kesterson, Sunnyvale, both of Calif.

[73] Assignee: Richard P. Wheat, Los Altos, Calif.

[22] Filed: Feb. 13, 1975

[21] Appl. No.: 549,752

[52] U.S. Cl................................. 140/147; 72/DIG. 10
[51] Int. Cl.² .................................................. B21F 1/02
[58] Field of Search............... 140/147; 72/DIG. 10

[56] References Cited
UNITED STATES PATENTS

| | | | |
|---|---|---|---|
| 3,321,825 | 5/1967 | Cooke | 140/147 |
| 3,447,224 | 6/1969 | Helda | 140/147 |
| 3,570,559 | 3/1971 | Palmer | 140/147 |
| 3,581,549 | 6/1971 | Kawasaki, et al | 140/147 |

*Primary Examiner*—Lowell A. Larson
*Attorney, Agent, or Firm*—Thomas Schneck, Jr.

[57] ABSTRACT

An apparatus for straightening ductile wire leads, as in an integrated circuit container of the T.O. type. The apparatus includes a seat for holding the base of a T.O. device, with leads projecting away from the base. A number of hooks are thrust inwardly by a motive means toward the leads, engaging the leads, and pulling them to a radially outward position. With the leads held in this position, the base of the T.O. device is lifted by another motive means thereby causing the leads to be pulled through respective hooks. The ductile leads are straightened as they are pulled through the hooks.

12 Claims, 13 Drawing Figures 3,941,165

WIRE LEAD STRAIGHTENING DEVICE

BACKGROUND OF THE INVENTION

A. Field of the Invention

The invention relates to apparatus for straightening wires, and more particularly, to an apparatus for straightening ductile electrode leads extending from a miniature device.

B. Prior Art

In the manufacture of semiconductor devices, solid state circuits are deposited on substrates which are subsequently housed in metallic, ceramic or plastic containers. Contact is made with the semiconductor material through wire leads which extend from the base portion of the semiconductor housing. One type of semiconductor housing is a cylindrical metal container which is designated as a T.O. device.

A T.O. device, as well as other semiconductor housings, have leads projecting therefrom which are ductile and susceptible to bending in a manufacturing process. In a typical manufacturing process, there is a finite expectation for a given number of devices with bent leads. Previously, it has been the typical industry practice to straighten leads by hand, using a wooden implement, often a pencil.

It has been recognized that a great deal of time and effort could be saved by an apparatus which quickly, efficiently and reliably straightened bent leads extending from the base of an object, specifically a semiconductor housing of the T.O. type. The term "T.O." means "transistor outline" and specifies a container for integrated circuits and transistors, usually metal, of cylindrical shape and having a plurality of wire leads extending downwardly from the base of the container.

It is therefore an object of the present invention to provide a lead straightening apparatus which will automatically straighten ductile wire leads extending from a base.

SUMMARY OF THE INVENTION

The above object is achieved with a lead straightener which includes a vertically movable holder having a circular seat therein for holding the base of the structure from which the leads project. The apparatus is provided with a plurality of radially spaced, laterally movable fingers, each having a hook at the radially inwardly end thereof, forming a die hook means for engaging wire leads. A first motive means is connected to the die hook means for radially inwardly moving the hooks to engage the wire leads, then moving them radially outwardly to a position corresponding to a straightened wire lead position relative to the base. Once each lead is held in such a straightened wire position, a second motive means, connected to the base, vertically moves the base away from the die hooks, forcing the wires to be straightened to pass through the die hooks, much like wire passing through a die. As the base is moved away from the hooks, the wires, being ductile, are able to undergo straightening, without breaking.

A control means for actuating the first and second motive means is provided. Upon receipt of electrical signals, the fingers with die hooks at the end of each are first extended and withdrawn, and then the base is moved away from the fingers and their corresponding hooks.

Electrical test apparatus may be connected to each finger for sending signals into each lead for electrical testing purposes while wire leads are being straightened. Shielding is provided about the electrical segments of the apparatus in order to prevent electrical noise from affecting sensitive components of the device whose leads are being straightened.

DESCRIPTION OF THE PREFERRED EMBODIMENT

Figure 1:
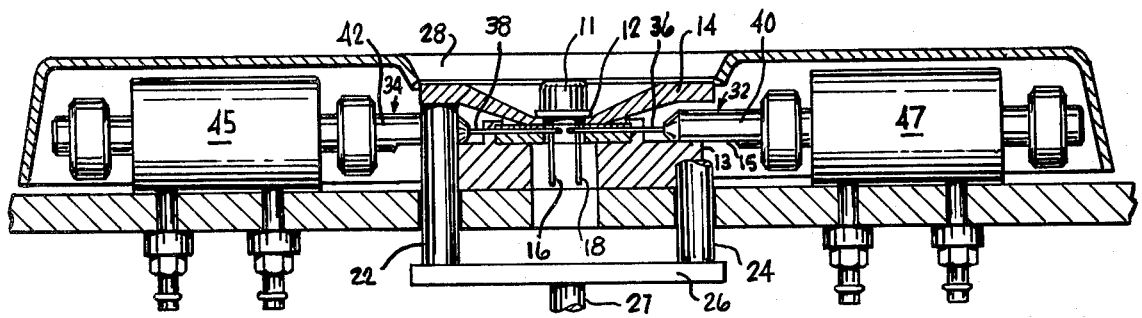
FIG. 1 is a side view of the apparatus of the present invention showing a semiconductor device in place with leads to be straightened.

The side view of FIG. 1 shows a semiconductor device 11 having a base 12 which is seated on a central portion of a plate 14.

From semiconductor device base 12, metal leads 16, 18 extend downwardly. A pair of spaced rods 22, 24, support plate 14 from below. A support arm 27 is connected to a second motive means below the support member 26 for raising and lowering plate 14. The motive means is typically an air cylinder which can advance and retract the support arm 27 upon command. Plate 14 is nested within an aperture defined in a housing 28 and passes through said housing without contact therewith. When plate 14 is in its fully downward position, as shown in FIG. 1, its upper outer circumference rests slightly below a depression in housing 28 so that semiconductor devices 11 can drop into plate 14 and more specifically into a central aperture defined in plate 14 which seats base 12 of semiconductor device 11.

Laterally movable die hook means 32, 34 are radially spaced about the semiconductor device 11. Each such die hook means includes a respective finger 36, 38 which terminates on one end in a hook, described below. At the opposite end, each of the die hook means 32, 34 terminates in a respective plunger 40, 42 associated with a respective cylinder 45, 47. The material from which the die hook means is made, is spring steel, known as piano wire.

Figure 2:
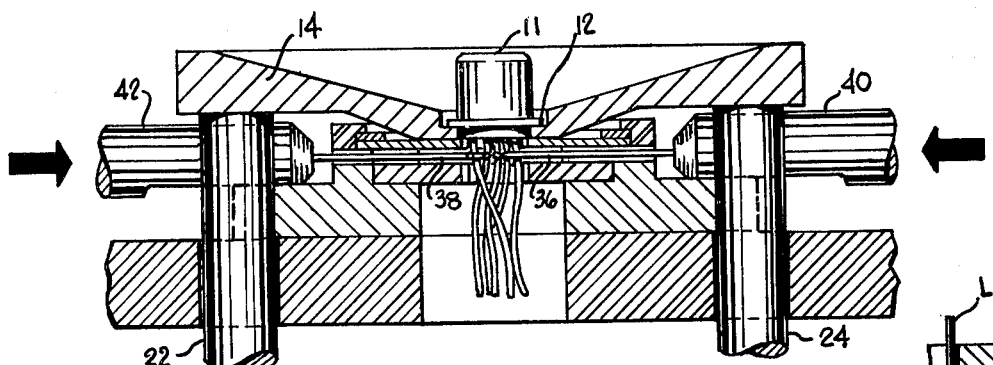
FIG. 2 is a close-up side view of the apparatus of FIG. 1, showing a radially inward thrusting of lead die hooks.
Figure 3:
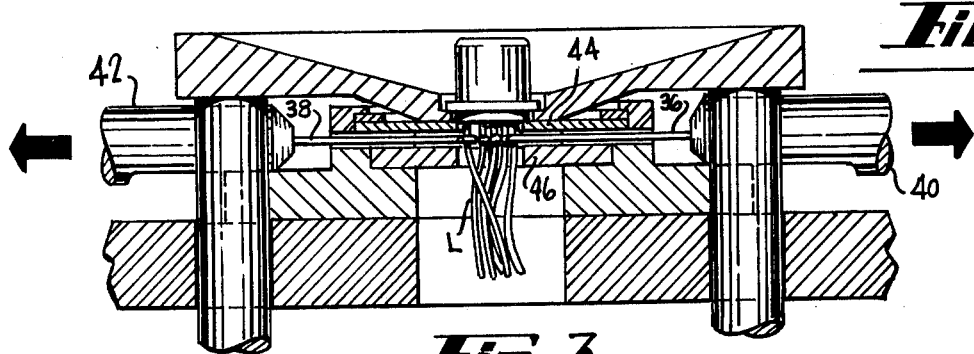
FIG. 3 is another side view showing a radially outward positioning of the lead die hooks shown in FIG. 2.
Figure 4:
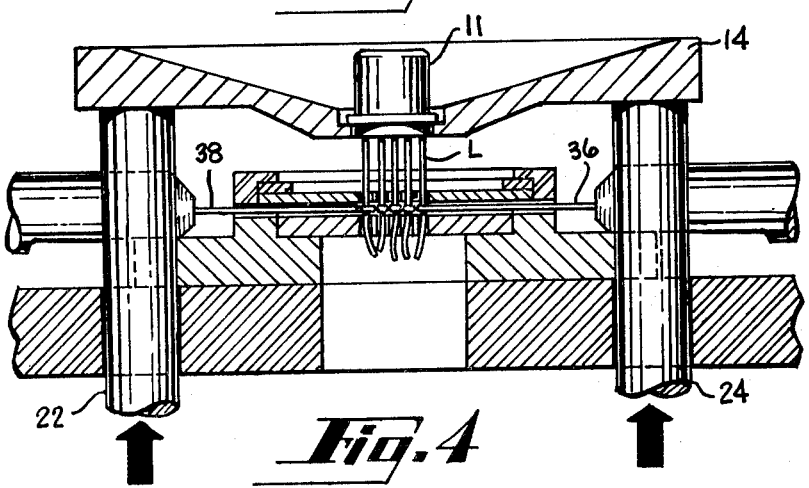
FIG. 4 is another side view of the apparatus of FIG. 2, showing an upward lifting of a semiconductor device and the drawing of its leads through the lead die hooks.

FIGS. 2, 3 and 4 illustrate motion of the plungers 40, 42 and the plate 14 in a lead straightening operation.

In FIG. 2, plungers 40, 42 are thrust inwardly in a horizontal plane parallel to and just below the base 12 until the extremities of fingers 36, 36 come into contact with respective leads to be straightened, as shown in more detail hereinafter. Hooks at the end of each finger engage respective leads by means of spring action.

Figure 5:
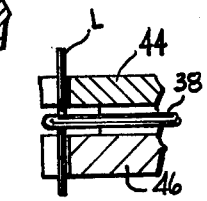
FIG. 5 is a side sectional view of a detail of the apparatus in FIG. 2.

In FIG. 3 plungers 40, 42 are withdrawn in the direction indicated by the arrowheads adjacent to respective plungers. The fingers 36, 38 pull respective leads radially outwardly to a position such that each lead abuts against a pair of parallel, spaced annular members 44, 46. This is more clearly illustrated in FIG. 5 where the lead L is shown to abut the radially inward edge of the annular members 44, 46 and is held in place by tension exerted on finger 38. Annual members 44, 46 are made of a tough polymer, such as molybdenum impregnated polytetraflouroethyelene.

In FIG. 4, upward motion of the rods 22, 24 is indicated by the arrowheads in the figure. Such upward motion occurs as the rods 22, 24 are pushed upwardly by a second motive means, not shown, in FIG. 4. As the base 14 moves upwardly, the semiconductor device 11 is pulled upwardly. The ductile leads L are pulled through respective hooks attached to fingers 36, 38, and other fingers not shown, as in an extrusion process, except that the diameter of the leads remains the same. The effect is that the ductile character of the leads, i.e. the "memory" of the leads, causes the leads to remain straight after having passed through the hooks associated with the fingers 36, 38 and the remaining fingers which are not shown in FIGS. 2, 3 and 4.

Figure 6:
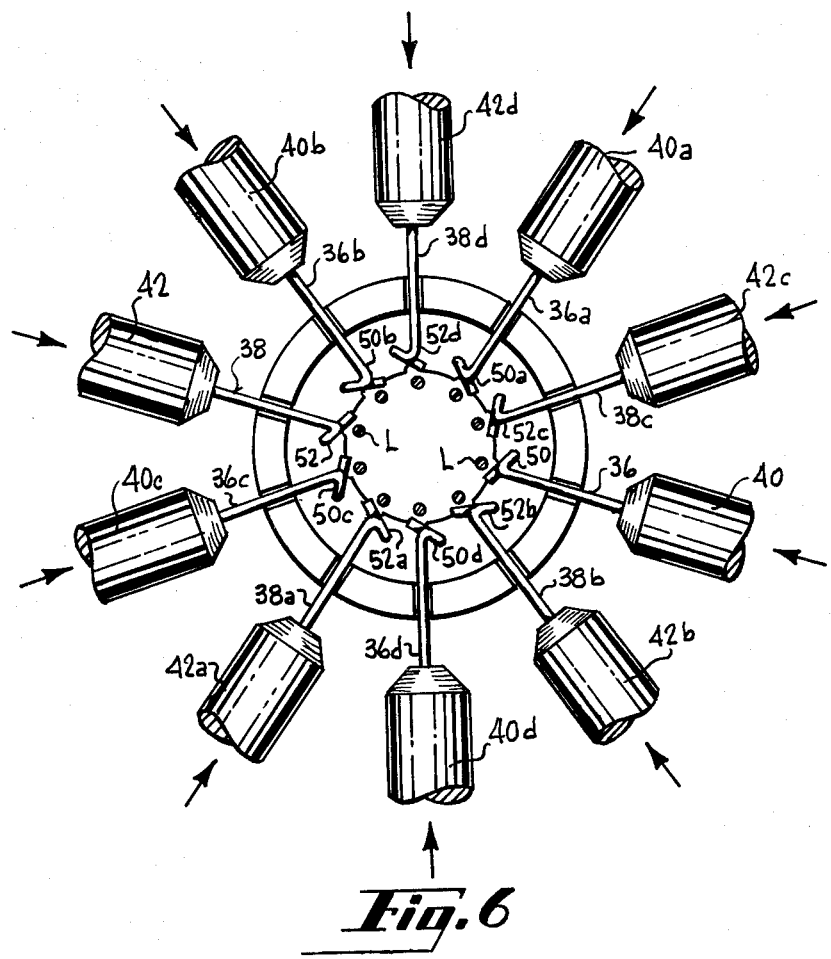
FIG. 6 is a top view over an annular member of the apparatus, showing a radially inward thrusting of lead die hooks.
Figure 7:
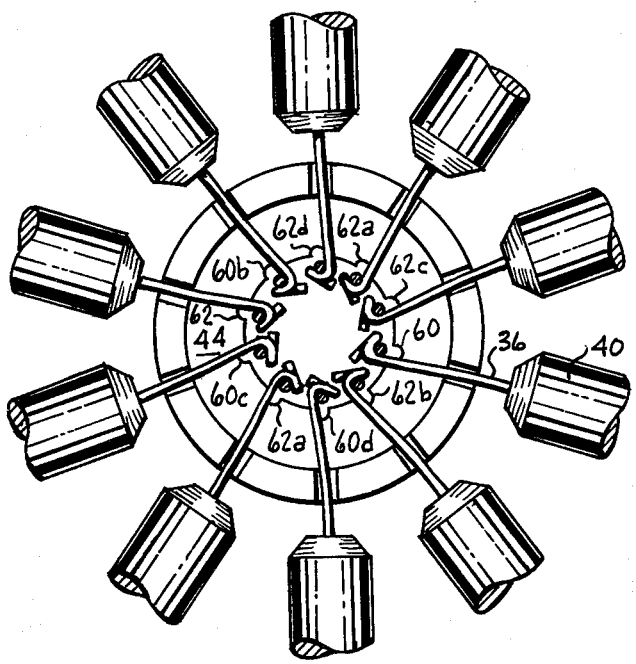
FIG. 7 is another top view, as in FIG. 6, showing die hooks of the apparatus fully inwardly extended and engaging leads to be straightened.
Figure 8:
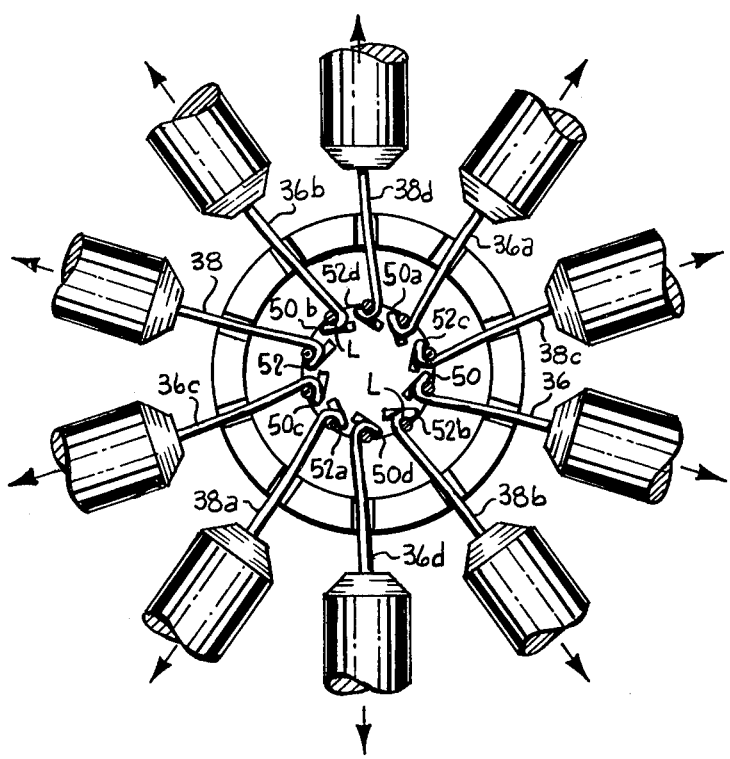
FIG. 8 is another top view, as in FIG. 6, showing die hooks of the apparatus fully outwardly extended, with leads corresponding to a straightened position.
Figure 9:
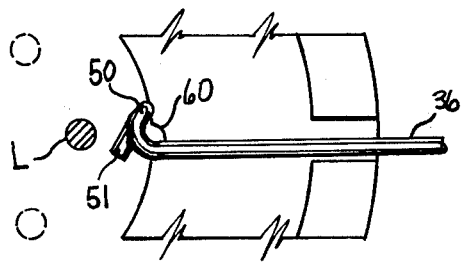
FIG. 9 is a top detailed view of the die hook means shown in FIGS. 6, 7, and 8.
Figure 10:
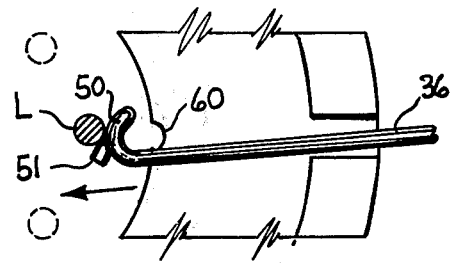
FIG. 10 shows the hook of FIG. 9 camming about a lead.
Figure 11:
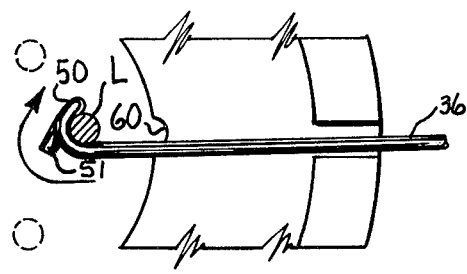
FIG. 11 shows the hook of FIG. 10 in intimate contact with a lead, having cammed about the lead.

FIGS. 6, 7 and 8 indicate the radial movement of the fingers, as well as the nature of the hook structure. In FIG. 6, the fingers 36, 36a, 36b, 36c, 36d, 38, 38a, 38b, 38c, 38d are shown attached at one end to respective plungers 40, 40a, 40b, 40c, 40d, 42, 42a, 42b, 42c, 42d and on the opposite inward end to arcuate hooks 50, 52 respectively. Radial inward motion of the plungers, 40, 42 is indicated by the arrowheads behind each plunger.

Hooks 50, 50a, 50b, 50c, 50d, 52, 52a, 52b, 52c, 52d approach each lead and cam about such leads as shown hereinafter until the hooks engage with the leads as shown in FIG. 7.

As an alternative to the camming action shown in FIG. 7, a flat hook, having a fish hook shape, may be inserted with its plane vertical. After the hook is past the position of the lead, i.e. fully radially inward, its plane is rotated to the horizontal so that each hook engages a respective lead. However, in the embodiments of FIGS. 1–4, such rotation is precluded because each plunger, i.e. plunger 40 is keyed by a flat spot 15 which slides on block 13, illustrated in FIG. 1.

Once engagement is complete, the plungers are withdrawn until each lead rests in a respective detent 60, 60a, 60b, 60c, 60d, 62, 62a, 62b, 62c, 62d in the annular members 44, 46. In FIG. 8, the respective fingers and hooks, having grasped the respective leads, are shown to have been withdrawn to respective outermost radial positions as indicated by the direction of the arrowheads in FIG. 8.

FIGS. 9, 10, 11 and 12 indicate the manner in which a hook cams about the lead L for engagement therewith. Note that the arcuate hook 50 has a curvature approximating that of lead L. The hook 50 has a tail 51 which extends below the plane defined by the curve which corresponds to the curvature of the lead L. The downwardly and backwardly extending tail 51 is a camming surface which first contacts the lead, as in FIG. 10, and pushes the hook around the lead, until an edge of the hook is in a position to snap around the lead as indicated by the arrow in FIG. 11.

Figure 12:
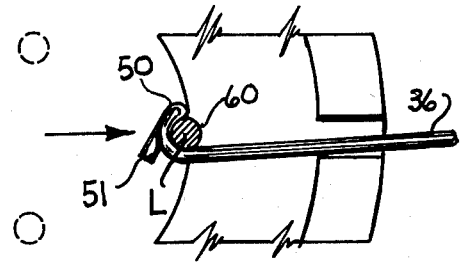
FIG. 12 shows the apparatus of FIG. 11 with a full outward retraction of the die hook means of the apparatus.

The next operation involves moving the finger and hook outwardly until the lead L rests against the detent 60 as shown in FIG. 12.

Figure 13:
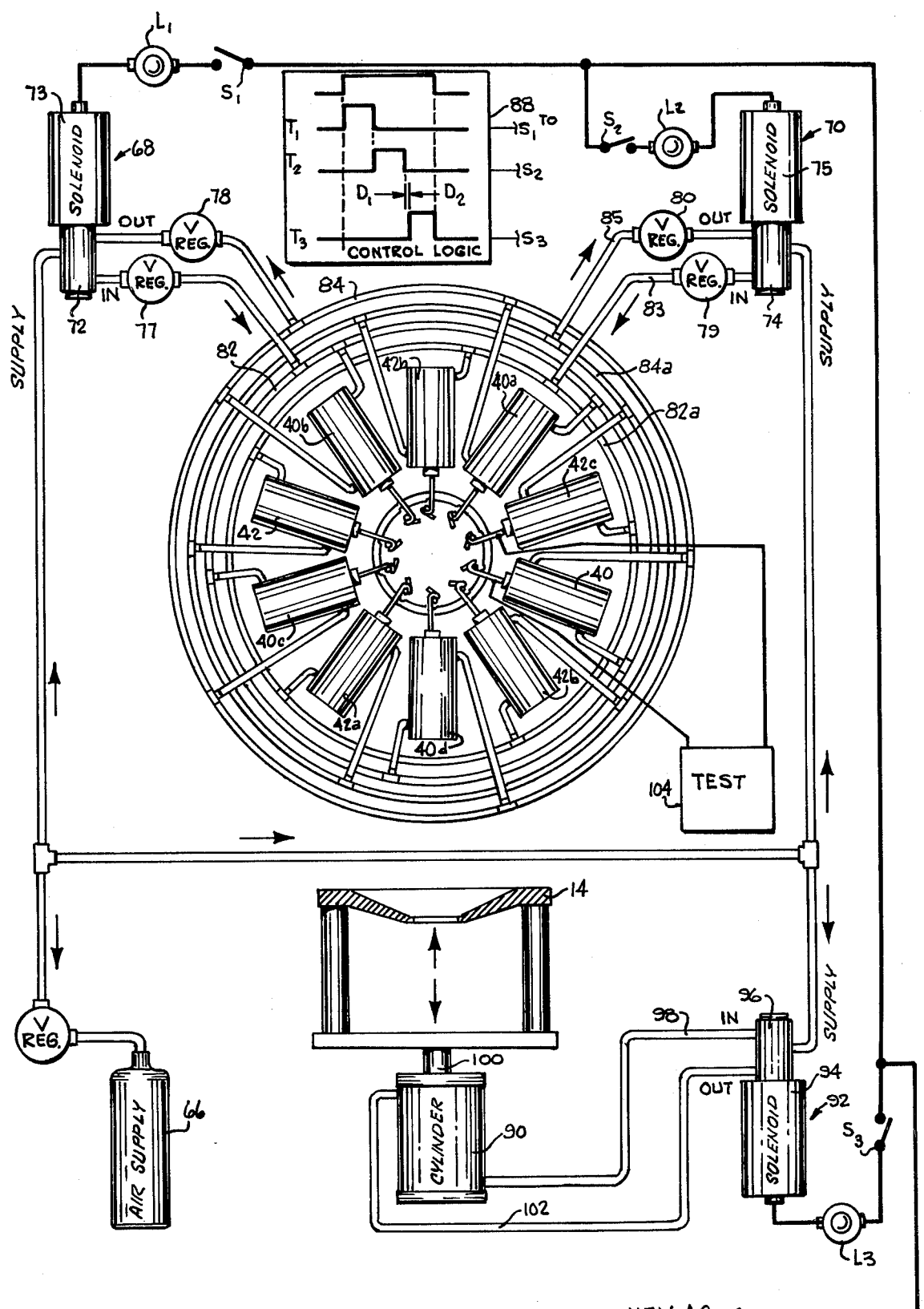
FIG. 13 is a schematic of the electrical and mechanical plan of the apparatus of FIG. 1.

FIG. 13 shows the electrical and mechanical plan for the invention. A gas supply 66, usually an air tank, is connected to first and second actuating means 68, 70. Each actuating means comprises an air cylinder 72, 74 respectively which is operated by a solonoid 73, 75 respectively. Each of the air cylinders 72, 74 is connected through a regulator valve 77, 79 respectively to a manifold set. The valves 77, 79 prevent the die hooks from being thrust inwardly too fast and are set at pressures such that inward thrusting of the die hooks does not damage leads.

A first manifold set consists of a first intake manifold 82 and a first exhaust manifold 84. Intake manifold 82 is connected to the supply 66 for thrusting of the fingers associated with each air cylinder 40, 40a, 40b, 40c, 40d, inwardly. When pressure is removed through the exhaust manifold, the return flow is regulated through a valve 78 so that leads to be straightened are gradually pulled back without damage. Intake manifold 82 is connected to every other air cylinder and correspondingly to alternate groups of fingers.

A second manifold set includes second intake manifold 83 and second exhaust manifold 85. An alternate group of air cylinders and corresponding fingers is connected to the second manifold set, namely air cylinders 42, 42a, 42b, 42c, and 42d. Both of the manifold sets 82, 84 and 82a, 84a form a first motive means for the die hook means.

Each actuating means 68, 70 is connected through a respective switch S1, S2 to a control means 88 which includes a pulser for producing the pulses indicated by the wave forms T1, T2, T3 within the box labelled 88. On the leading edge of each wave form the corresponding switch S1, S2, and S3 for each wave form, is closed and on the trailing edge the switch is open. For example on the leading edge of pulse T1, switch S1 is closed thereby energizing solenoid 73 and piston 72 such that air is injected into intake manifold 82 through valve 77. On the trailing edge of pulse T1 switch S1 is opened thereby deactivating solenoid 73 allowing air from the intake manifold to be transferred through each air cylinder 40, 40a, 40b, 40c, 40d to the exhaust manifold through a regulating valve 78 which controls the rate at which each finger associated with each respective air cylinder pulls a lead in the radially outward direction. When each switch is closed, a corresponding lamp L1, L2, L3 indicates the existence of current into the existing solenoid. A similar sequence occurs with respect to the T2 pulse.

While the waveforms T1 and T2 control switches S1 and S2, and hence the air cylinders 40, 40a, 40b, 40c, 40d, 42, 42a, 42b, 42c, 42d, waveform T3 controls closure of switch S3 and a second motive means, the air cylinder 90 through an actuating means 92 comprising a solenoid 94 and an air cylinder 96. On the leading edge of pulse T3, switch S3 closes thereby activating solenoid 94 and allowing high pressure air from supply 66 to pass into the third intake manifold 98 thereby pushing piston 100 upward from the air cylinder associated with the second motive means 90 and raising plate 14.

Upon the trailing edge of pulse T3 switch S3 is open and solenoid 94 is deenergized thereby causing air from the intake manifold to be exhausted through an exhaust manifold 102. The second motive means 90 includes a relatively large air cylinder and piston such that air from supply 66 causes relatively gradual upward movement so that there is no injury to the semiconductor leads as they are pulled through their respective die hook means.

A pulser, for generating wave forms of the well-known square wave type, T1, T2, T3, forms a signal means connected within the control means 88. The control means is merely a series of logic gates for enabling pulses from a square wave generator to pass sequentially through switches S1, S2 and S3. A slight delay exists between T2 and T3 to ensure that the die hooks are engaged before plate 14 is lifted. Arrows D1 and D2 indicate a delay interval. Typically, T1 and T2 are 200 to 500 milliseconds long, D1 to D2 is 50 to 100 milliseconds long and T3 is 200 to 500 milliseconds in length.

The entire control means 88 is electrically shielded so that the electromagnetic radiation from the control means will not affect the semiconductor device under test.

It should be noted that since each finger comes into contact with a respective lead, test equipment for testing various functions of the semiconductor device whose leads are to be straightened could be easily connected to each finger. For example, a continuity tester 104, which tests for shorts between two leads, could be connected to the fingers associated with the air cylinders 40, 42c. Similarly, test equipment which tested circuit functions of the semiconductor device, whose leads are to be straightened, would be similarly connected. Any test equipment must be electrically shielded when placed in proximity to the semiconductor device under test.

In the preceding description, the terms inwardly, outwardly, upward and downward and like terms have been used to describe relative motions. These terms should be understood in their relative sense only with regard to the drawings and not in any absolute sense.

We claim:

1. An apparatus for straightening a multiplicity of ductile wire leads extending from a base comprising,
 a vertically movable holder for holding said base,
 laterally movable die hook means for engaging a number of said wire leads,
 first motive means connected to said die hook means for radially inwardly moving said hook means and then outwardly moving said hook means to a withdrawn position corresponding to a wire lead straightening position relative to said base,
 second motive means connected to said base for vertically moving said base away from said die hook means, thereby pulling the wire leads attached to the base through the die hook means at the withdrawn position of said hook means, and
 means for actuating said first and second motive means.

2. The apparatus of claim 1 wherein said die hook means comprises,
 a plurality of radially spaced fingers, each finger having an elongated straight portion inwardly terminating at a first end, in an arcuate hook.

3. The apparatus of claim 2 wherein said radially spaced fingers comprise first and second groups of fingers, each group connected to said actuating means.

4. The apparatus of claim 3 further defined by a control means connected to said actuating means, said control means connected to a signal means for actuating said first and second group of fingers at different times.

5. The apparatus of claim 4 wherein said fingers in each of said first and second groups of fingers are connected to said control means for simultaneous motion.

6. The apparatus of claim 4 wherein said control means is electrically shielded.

7. The apparatus of claim 2 wherein said arcuate hook of each finger has a curvature approximating that of said wire leads.

8. The apparatus of claim 2 wherein said fingers are conductive and an electrical test means is connected to at least one of said fingers for making electrical contact with a wire lead when said finger is in intimate contact with said lead.

9. The apparatus of claim 1 wherein said vertically movable holder comprises a plate defining a central aperture with a circumferential rim means forming said seat for holding said base.

10. The apparatus of claim 9 further defined by a pair of juxtaposed annular members of equal diameter, both of said members being concentric with and below said central aperture, said annular members having radially spaced passageways of a dimension for inward and outward movement of said die hook means therein.

11. The apparatus of claim 9 wherein said plate is supported by a pair of parallel, spaced pistons, said pistons connected to said second motive means.

12. The apparatus of claim 1 wherein said first motive means comprises a high pressure gas supply connected to a plurality of gas cylinders.

* * * * *